（12） United States Patent
Billebaud

(10) Patent No.: US 6,202,931 B1
(45) Date of Patent: Mar. 20, 2001

(54) MEMORY CARD AND METHOD FOR PRODUCING SAME

(75) Inventor: Pascal Billebaud, Orleans (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 09/194,766
(22) PCT Filed: Jun. 5, 1997
(86) PCT No.: PCT/FR97/00995
 § 371 Date: Dec. 3, 1998
 § 102(e) Date: Dec. 3, 1998
(87) PCT Pub. No.: WO97/48074
 PCT Pub. Date: Dec. 18, 1997

(30) Foreign Application Priority Data

Jun. 7, 1996 (FR) .................................................. 96 07091

(51) Int. Cl.$^7$ ..................................................... G06K 19/00
(52) U.S. Cl. .......................... 235/487; 235/492; 235/451; 428/195
(58) Field of Search ..................................... 235/457, 487, 235/492, 488; 428/195

(56) References Cited

U.S. PATENT DOCUMENTS

| 4,591,945 | * | 5/1986 | Ugon ................................... 361/212 |
| 4,649,418 | * | 3/1987 | Uden .................................... 357/80 |
| 4,994,659 | * | 2/1991 | Yabe et al. ............................ 235/492 |
| 5,031,026 | * | 7/1991 | Ueda ..................................... 357/74 |
| 5,514,862 | * | 5/1996 | Salzano ................................ 235/487 |
| 5,834,755 | * | 11/1998 | Haghiri-Tehrani et al. .......... 235/492 |
| 5,888,624 | * | 3/1999 | Haghiri et al. ....................... 428/195 |

* cited by examiner

Primary Examiner—Karl D. Frech
Assistant Examiner—Daniel S. Felten
(74) Attorney, Agent, or Firm—Birch, Stewart, Kolasch & Birch, LLP

(57) ABSTRACT

The invention relates to a memory card of the type comprising a card body (1) having an integrated circuit (2) embedded in one face thereof, with said face carrying a conductor pattern (3) made up of a plurality of conductive areas (4) and of associated conductive tracks (5). According to the invention, a reinforcing element (10) implemented in the form of a closed ring is disposed in the thickness of the card body (1), in register with the zone occupied by the integrated circuit (2) so as to stiffen locally the zone of the card which carries the integrated circuit.

10 Claims, 1 Drawing Sheet

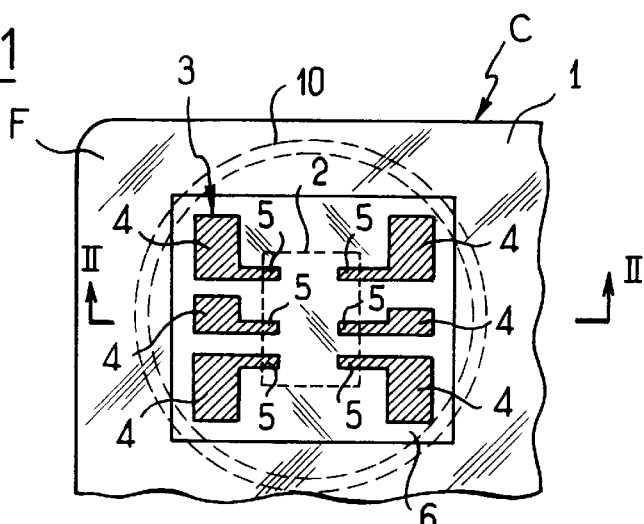
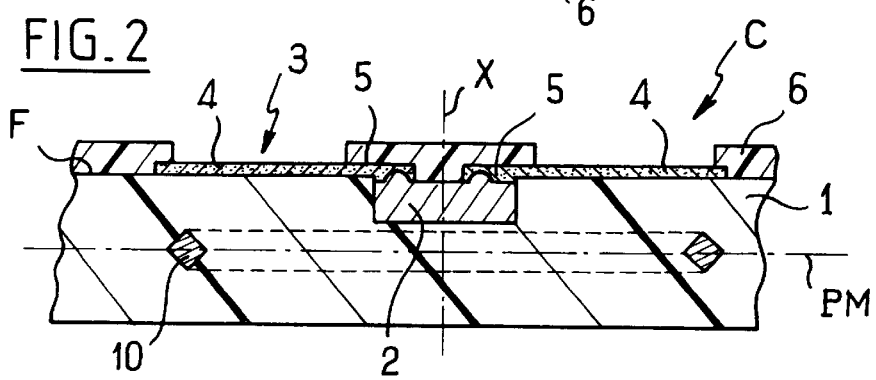
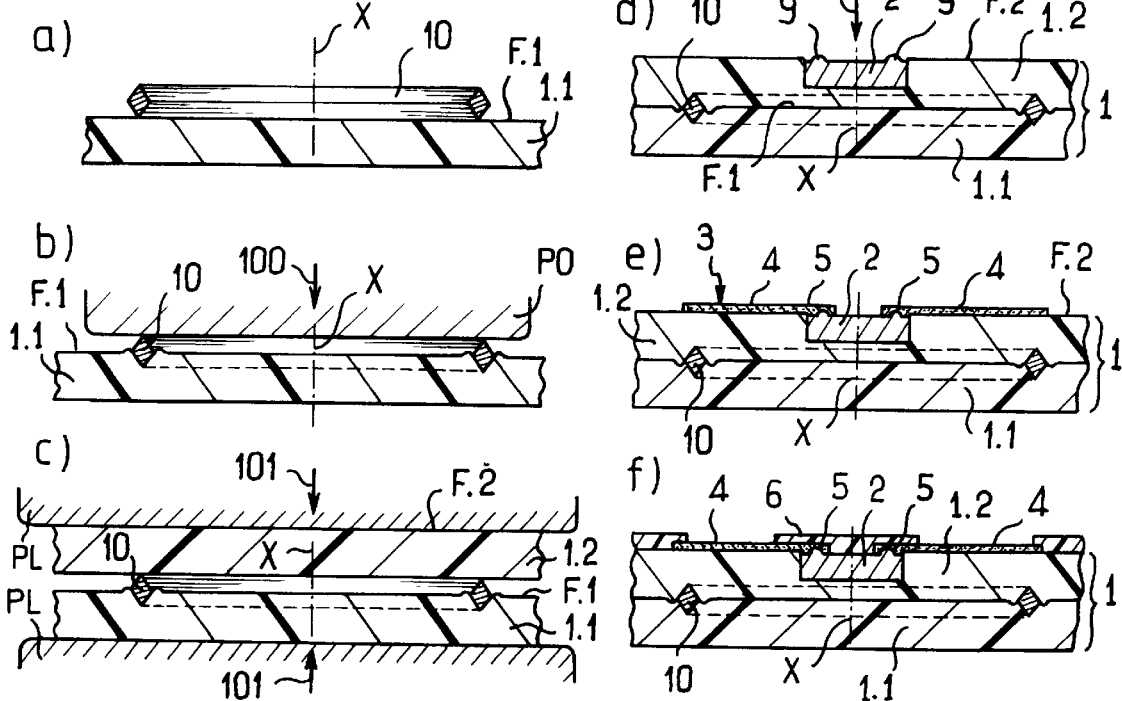

MEMORY CARD AND METHOD FOR PRODUCING SAME

The invention relates to a memory card having an integrated circuit, and more particularly to a memory card of the type comprising a card body having a face in which (or more precisely through which) an integrated circuit is embedded directly, and having on said face a conductor pattern constituted by a plurality of conductive areas and of associated read/write conductive tracks connecting said areas to the integrated circuit.

BACKGROUND OF THE INVENTION

By way of example, reference can be made to documents FR-A-2 671 461 and FR-A-2 684 471 in the name of the Applicant, which describe a memory card of the above-specified type.

This type of memory card having an integrated circuit embedded in the bulk of the card body is sometimes insufficiently reliable because of the stresses exerted on the edges of the integrated circuit when the card is subjected to bending or flexing. If a high degree of flexing is applied, then the curving of the card body runs the risk of destabilizing retention of the integrated circuit in the card body, and this can go as far as leading to said integrated circuit being expelled. In practice, it is commonplace to cover the conductor pattern, e.g. by means of a varnish that is usually transparent, while leaving the conductive areas of the conductor pattern uncovered. This protective layer participates in holding the integrated circuit in the card body in the event of said card body being flexed, however this holding is of limited effectiveness.

Consequently, there exists a need to improve the retention of an integrated circuit in a card body in order to obtain better resistance to the flexing that may be applied to the card.

This technical problem is already known for laminated cards, i.e. cards of the type comprising a hot-softenable core layer, two covering layers disposed on either side of the core layer, and a module integrated in the core layer and in one of the covering layers by hot-rolling after the various elements making up the card have been stacked on one another. For cards of that type, proposals have thus been made to put into place a belt surrounding the module and extending in the core layer so as to limit the bending forces to which the resin mass constituting the module is subjected, consequently reducing the risk of link members breaking (reference can be made in particular to document WO-A-92/01533 and EP-A-0 466 557).

Nevertheless, it is not possible to use those techniques with an integrated circuit that is embedded directly into the bulk of the card body since it would be quite impossible to place a belt around the integrated circuit.

Proposals have also been made to place a reinforcing plate in the bottom of a housing made in the card body for the purpose of stiffening the zone in which the integrated circuit is installed, as illustrated in document JP-A-61 095 486. Nevertheless, the reinforcement provided thereby is limited since neither the reinforcing plate nor the integrated circuit is embedded directly in the body of the card.

Document EP-A-0 189 039 describes a laminated card in which the integrated card is housed in a recess formed in a hard core disposed in the core layer of the card so as to provide a degree of protection to the integrated circuit when the card is subjected to deformation.

Document EP-A-0 311 434 describes a laminated card having an integrated circuit, in which a reinforcing element in the form of a star is disposed on each of the two faces of the card, on either side of the integrated circuit.

Finally, document EP-A-0 331 316 describes a laminated card in which the integrated circuit is surrounded by a deformable tubular element made of rubber which serves to absorb shocks and deformation when the card is handled.

Furthermore, document EP-A-0 128 822 describes a hot-pressing method of assembling an integrated circuit module in a card body. It should be observed that no reinforcing element is provided in the zone occupied by the integrated circuit.

OBJECTS AND SUMMARY OF THE INVENTION

An object of the invention is to solve the above-specified problem, by designing a memory card of the type having an integrated circuit embedded in the body of the card, in which the structure thereof serves to improve the reliability with which the integrated circuit is held in the card body.

According to the invention, this problem is solved by a memory card of the type comprising a card body having a face in which an integrated circuit is embedded directly, and having on said face a conductor pattern constituted by a plurality of conductive areas and of associated conductive tracks connecting said areas to the integrated circuit, wherein a reinforcing element implemented in the form of a closed ring, is buried in the material of the card body in register with the zone occupied by the integrated circuit, the ring extending in a plane to be substantially parallel to the above-specified face of the card body.

The closed reinforcing ring whose function is to stiffen locally the zone of the card which contains the integrated circuit and its electrical connections, thus achieves local stiffening of the card body, thereby enabling stresses in the zone concerned to be considerably reduced at the surfaces of the integrated circuit, and thus improving the reliability of the electrical connections.

Preferably, the closed ring forming the reinforcing element is disposed in register with the conductive areas of the conductor pattern. The stiffened zone thus extends beyond the zone which is in register with the conductive tracks, thereby providing the electrical connections with very satisfactory levels of reliability.

Preferably, the closed ring forming the reinforcing element is disposed substantially at half-thickness within the card body.

In a particular implementation, the closed ring forming the reinforcing element is a body of revolution about an axis, and the integrated circuit is essentially centered on said axis. The circular ring may also have a section that is rounded or quadrangular in shape: such a section facilitates embedding of the ring in the card body, by encouraging body material to creep around the side walls of said ring.

The closed ring forming the reinforcing element may be made of a rigid material, being made of an injected rigid plastics material, e.g. injectable polyacrylic or homopolymer polyoxymethylene, or a metal, e.g. steel or copper.

The invention also provides a method of fabricating a memory card having at least one of the above-specified characteristics, said method being remarkable in that it comprises the following successive steps:

a) a rigid closed ring is placed on a top face of a first sheet of thermoplastic plastics material;

b) said rigid ring is pressed hot into the first sheet;

c) a second sheet of thermoplastic plastics material is placed on the first sheet fitted with the rigid ring, and the first and second sheets are assembled together by hot pressing so as to constitute an assembly of thickness corresponding to the card body thickness required for the card that is to be made;

d) an integrated circuit is hot-pressed into the free top face of the second sheet until said integrated circuit is completely embedded therein, at a location such that the rigid ring is in register with the zone occupied by the integrated circuit; and e) a conductor pattern having conducive areas and associated conductive tracks is made in conventional manner on said free top face.

Preferably, step b) of hot-pressing the rigid ring is continued until said ring is partially embedded in the first sheet, and step c) is performed simultaneously with said rigid ring being simultaneously embedded in part in the second sheet. This ensures that the rigid ring is anchored in highly satisfactory manner in the bulk of the card body.

Preferably, the first and second sheets used are of substantially the same thickness, such that the location of the rigid ring lies substantially at mid-thickness within the card body, i.e. it lies in the midplane of said body (i.e. the plane containing its neutral fiber).

Finally, and preferably, step e) is followed by a conventional step f) in which the conductor pattern is covered by a protective layer leaving uncovered the conductive areas of said pattern.

BRIEF DESCRIPTION OF THE DRAWINGS

Other characteristics and advantages of the invention appear more clearly in the light of the following description and the accompanying drawing, relating to a particular embodiment, in which:

FIG. 1 is a fragmentary diagrammatic plan view of a memory card of the invention showing the zone thereof that includes the integrated circuit, the card body being fitted with a reinforcing ring buried in the thickness of the card body;

FIG. 2 is a fragmentary section on II—II of FIG. 1, showing more clearly the reinforcing ring disposed in the thickness of the card body; and FIG. 3 shows successive steps referenced a) to f) of a method of fabricating the above-specified memory card, in accordance with another aspect of the invention.

MORE DETAILED DESCRIPTION

FIGS. 1 and 2 show a memory card C of the invention, said card being of the type comprising a card body 1 of insulating material, e.g. polycarbonate, having a face (referenced F) in which an integrated circuit 2 is embedded, with said face F carrying a conductor pattern 3 constituted by a plurality of read/write conductive areas 4 and associated conductive tracks 5 connecting said areas to the integrated circuit 2. Specifically, a conductor pattern 3 is shown that is made up of a set of six conductive areas 4, each of which is connected to the integrated circuit 2 via an associated conductive track 5. Nevertheless, such an organization for the conductive track 3 naturally constitutes merely one possible example, and the invention should not be considered under any circumstances as being limited to one such particular conductor pattern.

According to an essential characteristic of the invention, a reinforcing element 10 organized as a closed ring is disposed in the thickness of the card body 1, in register with the zone occupied by the integrated circuit 2, the ring lying in a plane (referenced PM) extending substantially parallel to the above-specified face F of the card body 1. The zone concerned may be a zone directly beneath the integrated circuit 2 (the face F being seen from above), but said zone is preferably enlarged so as to include the zone underlying the conductive areas of the conductor pattern 3, so that the local stiffening of the card body applies to all of the conductive tracks of the conductor pattern, thereby optimizing electrical connection reliability.

In the plan view of FIG. 1, there can thus be seen such a reinforcing ring 10 which in the present case is circularly symmetrical about an axis X, with the integrated circuit 2 being essentially centered on said axis X. The inside diameter of the ring 10 is not smaller than the largest dimension of the integrated circuit, i.e. its diagonal if the integrated circuit is rectangular as in the present case. The outside diameter of said ring preferably corresponds to the largest dimension of the outline containing the conductive tracks of the conductor pattern. In FIG. 2, it can be seen that the closed ring 10 is disposed substantially halfway through the thickness of the card body 1, occupying the plane PM. The plane PM is thus the midplane of the card body 1, which plane contains the neutral fiber parallel to the longitudinal direction of the card and serving as the reference for deformation of said card body in the event of bending.

Specifically, the circular ring 10 is of a section that constitutes a quadrangle, in this case a diamond-shape with its tips pointing upwards and downwards. This particular embodiment facilitates implanting the closed ring 10 in the bulk of the card body, by enhancing creep of the plastics material over the side walls of the ring, as described in greater detail below with reference to FIG. 3 which shows the steps of the method of fabricating this memory card C. In a variant, it is possible to provide a section of different shape, in particular a section of rounded shape.

The closed ring 10 can be made of any rigid material that provides the reinforcement desired for the integrated circuit zone, and it is possible, for example, to use a plastics material such as an injectable polyacrylic (e.g. a polymethacrylate such as Plexiglass®) or a homopolymer polyoxymethylene (e.g. polyacetal), or indeed a metal, such as steel or copper.

FIGS. 1 and 2 also show a covering layer 6, e.g. made in the form of a transparent protective varnish, extending in part over the conductor pattern 3, while leaving the conductive areas 4 of said pattern uncovered. FIG. 1 shows a rectangular outline for said protective layer 6, but this naturally constitutes only one particular example.

The various successive steps of a method of fabricating a memory card of the above-described type are described below with reference to FIG. 3. The various successive steps of the method are referenced a) to f), with the characteristic steps being steps a) to c) since those are the steps that relate to implanting the above-mentioned reinforcing rigid ring in the card body.

In step a), a rigid closed ring 10 is disposed on a top face referenced F.1 of a first sheet 1.1 of thermoplastic material, the axis X of the ring being disposed at a point which corresponds to the center of the integrated circuit that is subsequently to be implanted in the card body by being embedded directly therein.

In step b), a punch PO exerts sufficient pressure on the top edge of the rigid ring 10 to cause said rigid ring to be pressed hot into the first sheet 1.1, with the downward movement of the punch PO as represented by arrow 100. Specifically, this step b) of hot pressing the rigid ring 10 is continued until said ring has been embedded partially (e.g. to half depth) in the first sheet 1.1. Small bulges are shown diagrammatically on either side of the middle portion of the rigid ring 10 to represent the thermoplastic material that is pushed back against the walls of the rigid ring while said rigid ring is being pressed in hot.

In step c), a second sheet 1.2 of thermoplastic plastics material is placed on the first sheet 1.1 fitted with the rigid ring 10, and the first and second sheets 1.1 and 1.2 are assembled together hot and under pressure so as to constitute an assembly of thickness corresponding to the thickness that is required of the card body that is to be made. Specifically, the figure shows assembly by applying pressure while hot as implemented by compression between two plates PL of a press, in which the top plate presses against the top face referenced F.2 of the second thermoplastic sheet 1.1. The urging together of the plates PL is represented by arrows 101. Such adhesion under pressure while hot can occur naturally by the thermoplastic material melting without there being any need to provide additional adhesive. In a variant, the hot press assembly operation could be performed by passing the sandwich constituted by the two superposed sheets between two rollers, using a well-known technique already in use for making laminated memory cards of the type mentioned above. Passing between two rollers makes it possible to perform hot pressure assembly on a continuous basis on thermoplastic sheets of great length, which assembled sheets can subsequently merely be cut up to constitute individual card bodies. The two sheets 1.1 and 1.2 are preferably made out of the same thermoplastic material, so that spontaneous adhesion between them is intimate and reliable. It will be observed that the adhesion between the two sheets takes place in the midplane of the resulting card body. Because the rigid ring 10 is embedded in part in the first sheet 1.1 during step b), step c) simultaneously causes said rigid ring 10 to be embedded in part in the second sheet 1.2. This guarantees extremely reliable bonding of the rigid ring 10 at an accurately determined location.

Subsequently implemented steps d), e), and f) are well known in the art in question for one-piece cards, and are therefore summarized only briefly below.

In step d), an integrated circuit 2 is pressed hot into the free top face F.2 of the second sheet 1.2 until said integrated circuit is fully embedded therein, with the circuit being embedded in a location such that the rigid ring 10 is in register with the zone occupied by the integrated circuit 2. This pressing operation is represented by arrow 102. As shown, steps are taken to ensure that the center of the integrated circuit 2 is disposed as accurately as possible on the axis X of the rigid ring 10. The pads of the integrated circuit 2 are referenced 9, which pads face outwards as is conventional in the technique for embedding an integrated circuit directly in a card body.

In step e), the conductor pattern 3 is made including its conductive areas 4 and the associated conductive tracks 5 which connect the areas 4 to the pads of the integrated circuit 2. This is preferably performed by depositing a conductive polymer on the top face F.2, in particular by using a silkscreen printing technique.

In step f), the conductor pattern 3 is covered by a protective layer 6, e.g. of transparent varnish, while leaving the conductive areas 4 of said pattern uncovered.

This provides a memory card that is of locally-reinforced stiffness in the zone that includes the integrated circuit and the electrical connections. This stiffening serves to protect the electric connections in the event of the card body being subjected to flexing.

The invention is not limited to the embodiment described, but on the contrary covers any variant that uses equivalent means to reproduce the essential characteristics specified above.

What is claimed is:

1. A memory card of the type comprising a card body having a face in which an integrated circuit is embedded directly, and having on said face a conductor pattern constituted by a plurality of conductive areas and of associated conductive tracks connecting said areas to the integrated circuit, wherein a reinforcing element implemented in the form of a closed ring, is buried in the material of the card body in register with the zone occupied by the integrated circuit, the ring extending in a plane (PM) to be substantially parallel to the above-specified face of the card body.

2. A memory card according to claim 1, wherein the closed ring forming the reinforcing element is disposed in register with the conductive areas of the conductor pattern.

3. A memory card according to claim 1 or claim 2, wherein the closed ring forming the reinforcing element is disposed substantially at half-thickness within the card body.

4. A memory card according to claim 1, wherein the closed ring forming the reinforcing element is a body of revolution about an axis, and the integrated circuit is essentially centered on said axis.

5. A memory card according to claim 4, wherein the circular ring has a section that is rounded or that is quadrangular in shape.

6. A memory card according to claim 1, wherein the closed ring forming the reinforcing element is made of a rigid material, being made of an injected rigid plastics material or a metal.

7. A method of fabricating a memory card having at least one of the characteristics of claim 1, the method wherein comprises the following successive steps:
   a) a rigid closed ring is placed on a top face of a first sheet of thermoplastic plastics material;
   b) said rigid ring is pressed hot into the first sheet;
   c) a second sheet of thermoplastic plastics material is placed on the first sheet fitted with the rigid ring, and the first and second sheets are assembled together by hot pressing so as to constitute an assembly of thickness corresponding to the card body thickness required for the card that is to be made;
   d) an integrated circuit is hot-pressed into the free top face of the second sheet until said integrated circuit is completely embedded therein, at a location such that the rigid ring is in register with the zone occupied by the integrated circuit; and
   e) a conductor pattern having conducive areas and associated conductive tracks is made in conventional manner on said free top face.

8. A method according to claim 7, wherein step b) of hot-pressing the rigid ring is continued until said ring is partially embedded in the first sheet, and step c) is performed simultaneously with said rigid ring being simultaneously embedded in part in the second sheet.

9. A method according to claim 7 or claim 8, wherein the first and second sheets used are of substantially the same thickness.

10. A method according to claim 7, wherein characterized in that step e) is followed by a conventional step f) in which the conductor pattern is covered by a protective layer leaving uncovered the conductive areas of said pattern.

* * * * *